United States Patent
Lee et al.

(10) Patent No.: US 6,764,893 B2
(45) Date of Patent: Jul. 20, 2004

(54) METHOD FOR REDUCING A PARASITIC CAPACITANCE OF A SEMICONDUCTIVE MEMORY CELL USING METAL MASK FOR SIDEWALL FORMATION

(75) Inventors: Sung-Kwon Lee, Ichon-shi (KR); Dong-Sauk Kim, Ichon-shi (KR)

(73) Assignee: Hynix Semiconductor Inc., Kyoungki-do (KR)

( * ) Notice: Subject to any disclaimer, the term of this patent is extended or adjusted under 35 U.S.C. 154(b) by 5 days.

(21) Appl. No.: 10/314,214

(22) Filed: Dec. 9, 2002

(65) Prior Publication Data

US 2004/0014278 A1 Jan. 22, 2004

(30) Foreign Application Priority Data

Jul. 19, 2002 (KR) ................................ 10-2002-0042287

(51) Int. Cl.[7] .......................................... H01L 21/8238
(52) U.S. Cl. ...................... 438/233; 438/184; 438/299; 438/320; 438/339; 438/366
(58) Field of Search ................................ 438/180, 184, 438/230, 233, 299, 320, 339, 364–366, FOR 185

(56) References Cited

U.S. PATENT DOCUMENTS 6,538,295 B1 * 3/2003 Bronner et al. ............. 257/412

2003/0094651 A1 * 5/2003 Suh ............................ 257/331
2003/0203605 A1 * 10/2003 Mori et al. .................. 438/586
2004/0023478 A1 * 2/2004 Samavedam et al. ....... 438/592

* cited by examiner

*Primary Examiner*—George Fourson
*Assistant Examiner*—Thanh V Pham
(74) *Attorney, Agent, or Firm*—Birch, Stewart, Kolasch & Birch, LLP

(57) ABSTRACT

The present invention provides a method for reducing loading capacitance. The inventive method includes the steps of: forming a plurality of patterns on a substrate, wherein the patterns are formed by stacking and patterning a first conductive layer, a silicon nitride mask layer and a metal mask layer on the substrate; depositing a first silicon oxide layer along the profile containing the patterns; etching the first silicon oxide layer for forming a silicon oxide spacer with a height lower than a top part of the silicon nitride mask layer so as to partially expose a top part of lateral sides of patterns and simultaneously etching the metal mask layer to expose the silicon nitride mask layer, wherein the metal mask layer prevents losses of the silicon nitride mask layer; forming a silicon nitride spacer on a surface of the silicon oxide spacer and the lateral sides of the patterns; forming a second silicon oxide layer on an entire structure in which the silicon nitride spacer is formed; etching selectively the second silicon oxide layer to expose silicon nitride layer spacer and forming a self-align contact hole that is partially expanded to the top portion of the patterns; and forming a self-align contact structure by filling the self-align contact hole with a second conductive layer.

17 Claims, 7 Drawing Sheets

METHOD FOR REDUCING A PARASITIC CAPACITANCE OF A SEMICONDUCTIVE MEMORY CELL USING METAL MASK FOR SIDEWALL FORMATION

FIELD OF THE INVENTION

The present invention relates to a method for fabricating a semiconductor device; and, more particularly, to a method for fabricating a semiconductor device capable of reducing a parasite capacitance of a semiconductive memory cell.

DESCRIPTION OF RELATED ARTS

As integration of a semiconductor device has been more enhanced, it becomes more difficult to obtain an overlay accuracy and a process margin with respect to a pattern formation process through the use of a photo registry. Hence, a self align contact (hereinafter referred as to SAC) process is specifically adapted and applied to solve these problems. The SAC process is an etching process that etches an object by using a previously deposited material itself instead of using an additional mask. Because of this characteristic, the SAC process reduces remarkably costs related to a fabrication of a semiconductor device. The SAC process itself uses several methods for achieving an effective etching, and a nitride layer is representatively used as an etching barrier among those various methods.

Therefore, the SAC etching process first encompasses lateral and top parts of a conductive pattern including a gate electrode and so forth with the nitride layer and etches an insulation layer under a condition in that an oxide layer is etched faster than the nitride layer.

Meanwhile, a polysilicon nitride layer and a polysilicon oxide layer are representatives of the nitride layer and the oxide layer, respectively. Particularly, the polysilicon nitride layer of which dielectric constant is approximately 7.5 has a higher dielectric constant than a polysilicon oxide layer of which dielectric constant is approximately 3.9.

A plug structure that uses a contact hole, which is formed by the SAC process, is applied to a semiconductive memory device such as a dynamic random access memory (DRAM). For instance, in case that a capacitor hole is formed by the SAC process with respect to a bit line, i.e., in case that the SAC process forms the capacitor hole by etching spaces between the bit lines, the bit line and the capacitor contact plug, that is, capacitance of the bit line is increased more than a conventional contact structure wherein a charge storage electrode is insulated with the oxide layer, e.g., the polysilicon oxide layer. However, the increase of the bit line capacitance becomes a factor for decreasing the capacitance of a cell.

There have been numerous attempts to overcome a problem of the decrease in the cell capacitance due to the nitride layer applied in accordance with the SAC process. FIG. 1 is a cross-sectional view illustrating a semiconductor device fabricated in accordance with a conventional method suggested for solving the problem of the decrease in the cell capacitance due to the SAC process.

Referring to FIG. 1, a conductive pattern 13 including a mask layer 12 constructed with a silicon nitride layer and overlies a conductive layer 11 and a metal layer 11 constructed with polysilicon, tungsten (W), titanium (Ti) or titanium nitride (TiN) is formed on a substrate board 10. Especially, the conductive pattern 13 is patterned in a line form being spaced out with a predetermined distance S between the conductive patterns 13.

On lateral sides of each conductive pattern 13, a dual spacer including a silicon oxide layer spacer 14 and a silicon nitride layer spacer 15 is formed. The silicon oxide layer spacer 14 is particularly formed with a height lower than a top part of the mask layer 12 using the silicon nitride layer to expose partially top portions of the lateral sides of the conductive pattern 13. The silicon nitride layer spacer 15 is an outer spacer of the dual spacer structure being formed continuously on the exposed lateral portions of the conductive pattern 13 and the silicon oxide layer spacer 14.

The silicon oxide layer spacer 14, as the name itself indicates, is constructed with the silicon oxide layer deposited through a chemical vapor deposition (hereinafter referred as to CVD) technique until having a thickness greater than approximately 300 Å measured from the top portion of the mask layer 12 to that of the silicon oxide layer spacer 14. Also, it is alternatively possible to form the top portion of the silicon oxide layer spacer 14 to be lower than a bottom portion of the mask layer 12.

On the conductive pattern 13 and the substrate 10, an insulation layer 16 constructed with a silicon oxide layer possessing a SAC contact hole is formed. The insulation layer is partially expanded onto the top portion of each conductive pattern 13 and exposes the silicon nitride layer spacer 15 allocated within the predetermined distance S between the conductive patterns 13.

The SAC contact hole is filled with a plug 17 and self-aligned on the conductive pattern 13, forming a SAC structure. The plug 17, in addition to the above-described form, can be patterned with a preset patterning form through a conventional photo etching process.

In accordance with the conventional method as describe above, the conductive pattern, for instance, the dual spacer including the silicon oxide layer spacer and the silicon nitride layer spacer is formed on the lateral sides of the bit line. The dual spacer structure makes it possible to reduce the loading capacitance between the conductive layer and plug within the SAC contact hole, because the lateral sides of the conductive layer is encompassed with the silicon oxide layer spacer having a low dielectric constant.

However, in the Korean Patent Application Laid-Open No. 2000-0048819 suggested for embodying the method illustrated in FIG. 1, there is discovered a difficulty in forming each conductive pattern, e.g., a silicon oxide layer spacer on lateral sides of a bit line, of which height is lower than a top portion of the mask layer constructed with a silicon nitride layer since a selection ratio between the silicon oxide layer and the silicon nitride layer is not high in an actually practiced wafer having a micro-shape. In other words, the mask layer constructed with the silicon nitride layer is inevitably damaged during procedure proceedings, and thus, it is impossible to be applicable for a practical process.

SUMMARY OF THE INVENTION

It is, therefore, an object of the present invention to provide a method for fabricating a semiconductor device capable of preventing losses of a mask layer constructed with a silicon nitride layer when forming a dual spacer for reducing loading capacitance including a silicon oxide layer and a silicon nitride layer spacers.

In accordance with an aspect of the present invention, there is provided a method for a method for fabricating a semiconductor device, including the steps of: forming a plurality of patterns on a substrate, wherein the patterns are formed by stacking and patterning a first conductive layer, a silicon nitride mask layer and a metal mask layer on the substrate; depositing a first silicon oxide layer along the profile containing the patterns; etching the first silicon oxide layer for forming a silicon oxide spacer with a height lower than a top part of the silicon nitride mask layer so as to partially expose a top part of lateral sides of patterns and simultaneously etching the metal mask layer to expose the silicon nitride mask layer, wherein the metal mask layer prevents losses of the silicon nitride mask layer; forming a silicon nitride spacer on a surface of the silicon oxide spacer and the lateral sides of the patterns; forming a second silicon oxide layer on an entire structure in which the silicon nitride spacer is formed; etching selectively the second silicon oxide layer to expose silicon nitride layer spacer and forming a self-align contact hole that is partially expanded to the top portion of the patterns; and forming a self-align contact structure by filling the self-align contact hole with a second conductive layer.

In accordance with another aspect of the present invention, there is also provided a method for a method for fabricating a semiconductor device, including the steps of: forming a first inter-layer insulating layer on a substrate constructed with transistors including a gate, a capacitor contact area and a bit line contact area; etching selectively the first inter-layer insulating layer so as to form a bit line contact hole that exposes the bit line contact area; forming a plurality of bit line patterns contacted to the bit line contact area through the bit line contact hole, a silicon nitride mask layer on the bit line patterns and a metal mask layer on the silicon nitride mask layer; depositing a silicon oxide layer along a profile containing the bit line patterns; etching the silicon oxide layer to form a silicon oxide spacer with a height lower than a top part of the silicon nitride mask layer so as to expose partially a top part of lateral sides of the bit line patterns and simultaneously etching the metal mask layer to expose the silicon nitride mask layer, wherein the metal mask layer prevents losses of the silicon nitride mask layer; forming a silicon nitride spacer on the lateral sides of the bit line patterns and a surface of the silicon oxide layer spacer; forming a second inter-layer insulating layer on an entire structure in which the silicon nitride spacer is formed; etching selectively the second inter-layer insulating layer to expose the silicon nitride layer spacer on the capacitor contact area and forming a self-align contact hole expanding partially over each of the bit line patterns; and forming a self-align contact structure by filling the self-align contact hole with a conductive layer.

In accordance with further aspect of the present invention, there is also provided a method for fabricating a semiconductor device possessing a particular structure for reducing loading capacitance with a spacer on lateral sides of a bit line as a capacitor conductive layer is formed. Herein, a silicon oxide layer spacer is formed with a height lower than a top part of a mask layer using a silicon nitride layer of a bit line by using a silicon oxide layer, while a silicon nitride layer spacer is formed on exposed lateral sides of the bit line and a surface of the silicon oxide layer spacer. Also, in order to prevent losses of the mask layer using the silicon nitride layer caused by a limitation in an etching selection ratio between the silicon oxide layer and the silicon nitride layer during an etching process for forming the silicon oxide layer spacer, a metal mask layer having a dual hard mask structure stacked on the mask layer using the silicon nitride layer is formed, and the silicon oxide layer is etched so as to remove the metal mask layer when forming the silicon oxide layer spacer.

BRIEF DESCRIPTION OF THE DRAWING(S)

The above and other objects and features of the present invention will become apparent from the following description of the preferred embodiments given in conjunction with the accompanying drawings, in which.

DETAILED DESCRIPTION OF THE INVENTION

Other objects and aspects of the invention will become apparent from the following description of the embodiments with reference to the accompanying drawings, which is set forth hereinafter.

Figure 1:
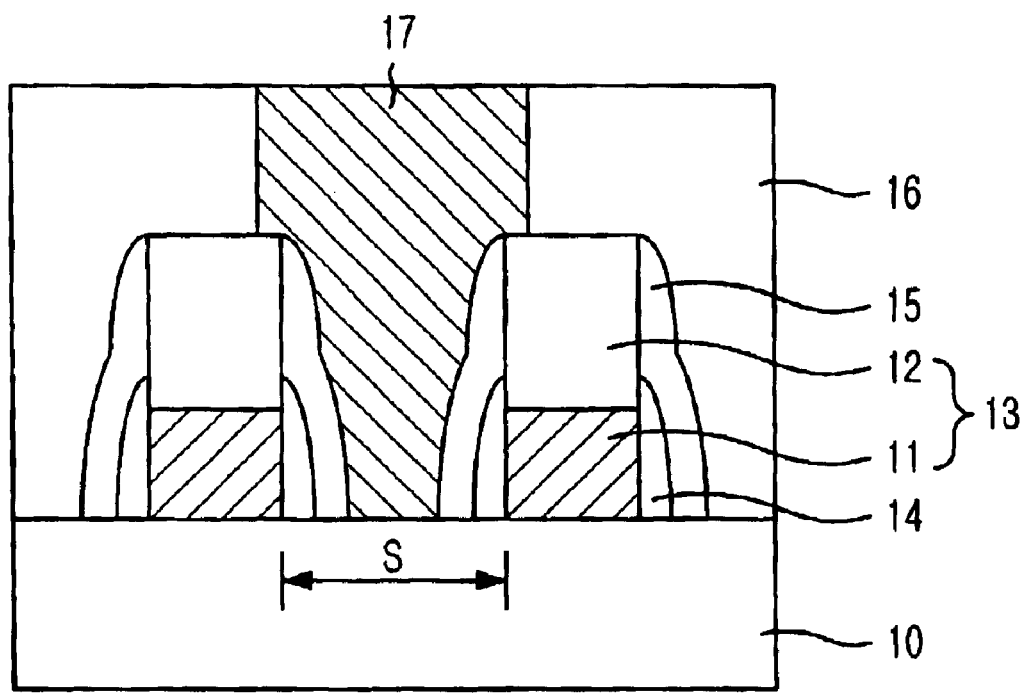
FIG. 1 is a cross-sectional view of a semiconductor device fabricated in accordance with a conventional method proposed to solve a problem of a decrease in cell capacitance.
Figure 2:
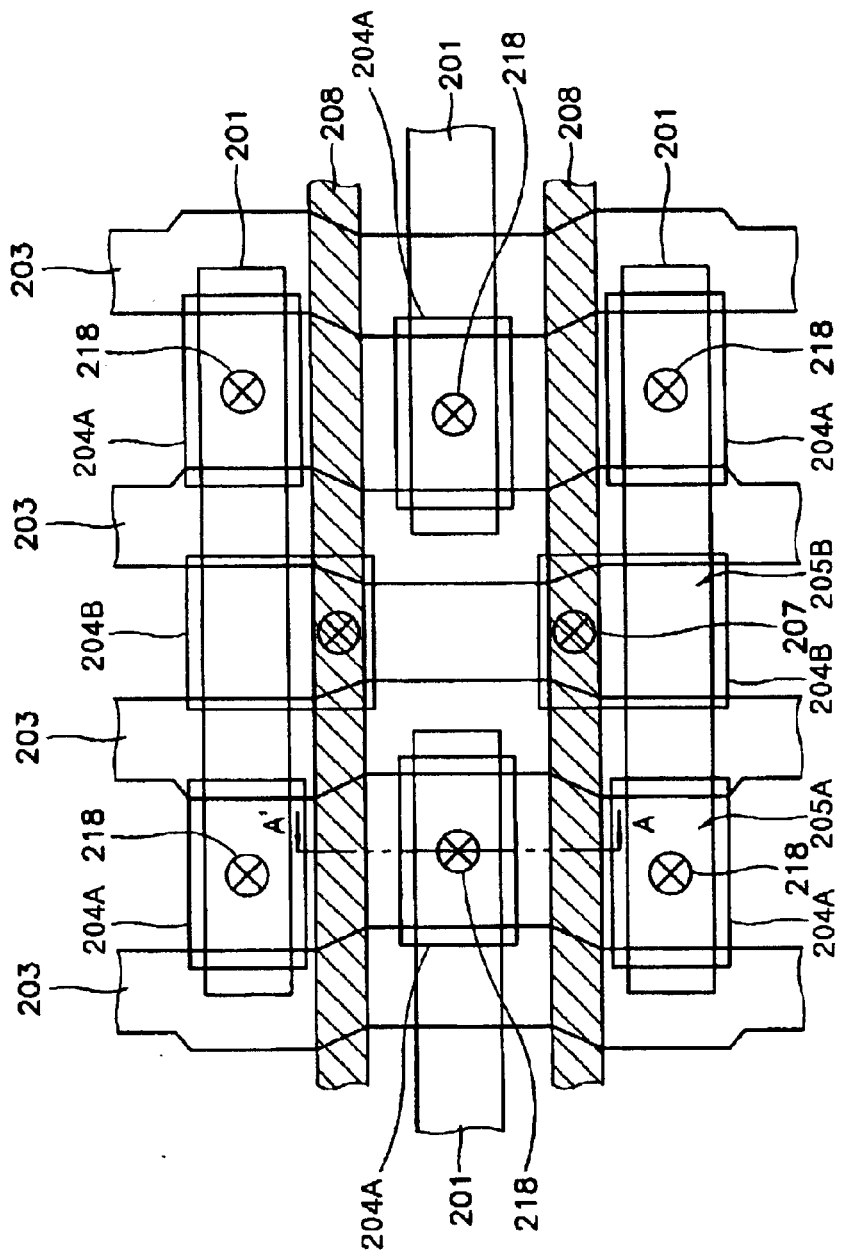
FIG. 2 is a plane view of a semiconductor device to which a preferred embodiment of the present invention is applied.
Figure 3:
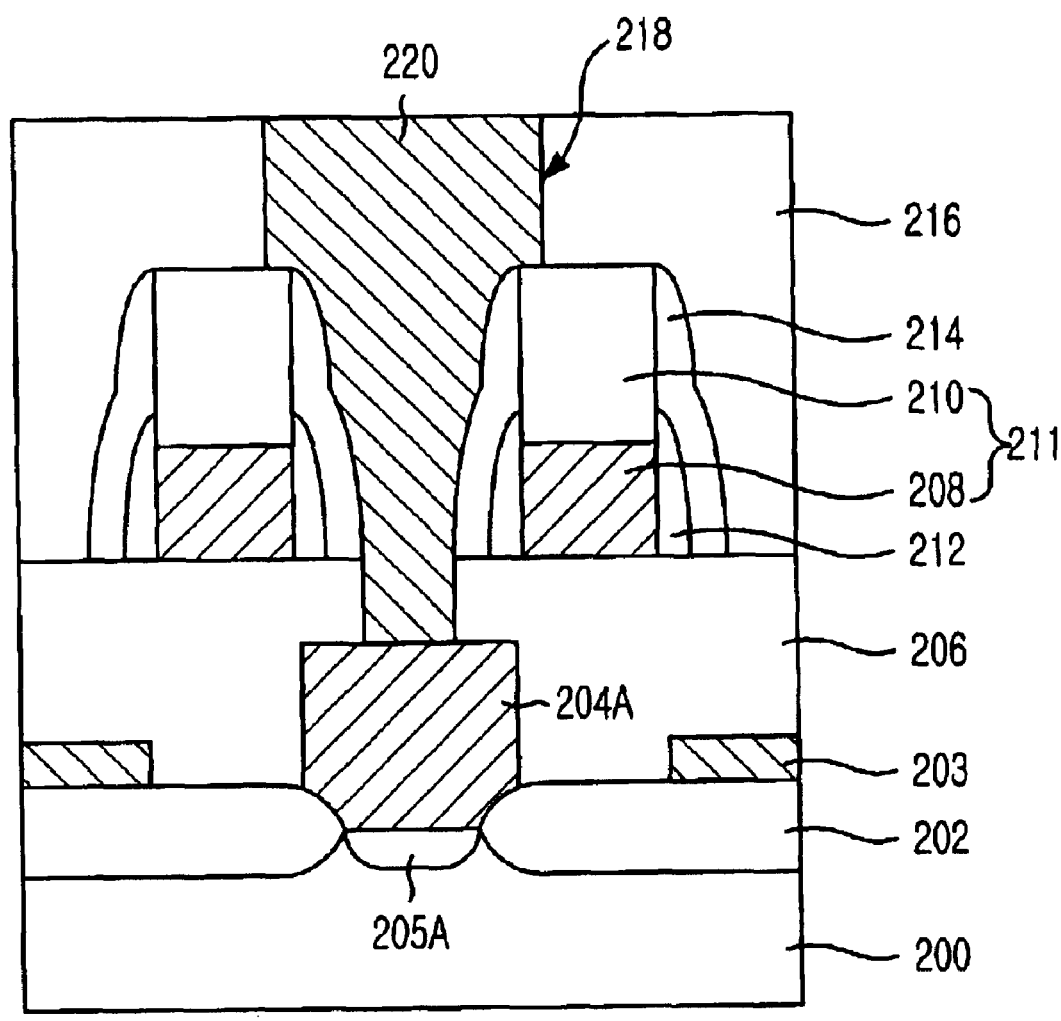
FIG. 3 is a cross-sectional view in a direction of A–A' of FIG. 2 illustrating a semiconductor device having a self-align contact (SAC) structure in accordance with the preferred embodiment of the present invention.

FIG. 2 is a cross-sectional view of a semiconductor device to which a preferred embodiment of the present in accordance with the present invention is applied, and particularly, a memory cell area is illustrated in FIG. 2. FIG. 3 is a cross-sectional view in a direction of A–A' of FIG. 2 illustrating a semiconductor device that has a self-align contact (SAC) structure in accordance with the preferred embodiment of the present invention.

Referring to FIGS. 2 to 3, a transistor including a gate 203 provided to a word line, a capacitor contact area, e.g., a source area 205A and a bit line contact area, e.g., a drain area 205B is formed on a semiconductive substrate 200. Herein, the semiconductive substrate 200 is separated as an activation area 201 and a device division area via a field oxide layer 202. It is also possible to form pad electrodes 204A and 204B for decreasing an aspect ratio of contact holes formed on the source and drain areas 205A and 205B of the transistor.

On the transistor and the substrate 200, a first inter-layer insulating layer 206 possessing a bit line contact hole 207 for exposing the pad electrode 204B contacted to the drain area 205B is formed.

A bit line conductive pattern 211 including a bit line 208 electrically connected to the drain area 205B through the bit line contact hole 207 and a mask layer 210 constructed with a silicon nitride layer and stacked on the bit line 208 is formed on the first inter-layer insulating layer 206. Each bit line conductive pattern 211 is patterned in a line form, and the pad electrode 204A contacted to the capacitor contact area, i.e., the source area 205A is positioned below the space set between the bit line conductive patterns 211.

On lateral sides of each bit line conductive pattern 211, a dual spacer including a silicon oxide layer spacer 212 and a silicon nitride layer spacer 214. The silicon oxide layer spacer 212 is formed with a height lower than a top part of the mask layer 210. Herein, the silicon oxide layer spacer 212, as the name itself indicates, is formed by employing a chemical vapor deposition (hereinafter referred as to CVD) technique.

The silicon nitride layer spacer 214 is an outer spacer of the dual spacer, being formed continuously on a surface of the silicon oxide layer spacer 212 and the lateral sides of each bit line conductive pattern 211.

A second inter-layer insulating layer 216 is formed on the bit line conductive pattern 211 and the first inter-layer insulating layer 206. A self-align contact (hereinafter referred as to SAC) hole 218 that exposes the silicon nitride layer spacer 214 overlying the capacitor contact area, e.g., the source area 205A and expands partially on the top part of each bit line conductive pattern 211 is formed on the second inter-layer insulating layer 216.

The SAC contact hole 218 is filled with a capacitor conductive layer 220, which forms the SAC structure by being self-aligned in the bit line conductive pattern 211. As illustrated in FIG. 3, the capacitor conductive layer 220 can be formed in a contact plug form and patterned in a storage electrode pattern via a conventional photo registry.

FIGS. 4A to 4H are cross-sectional views illustrating a process for fabricating a semiconductor device described in FIG. 3. With reference to FIGS. 4A to 4H, the process for fabricating a semiconductor device will be explained in more detail.

Figure 4A:
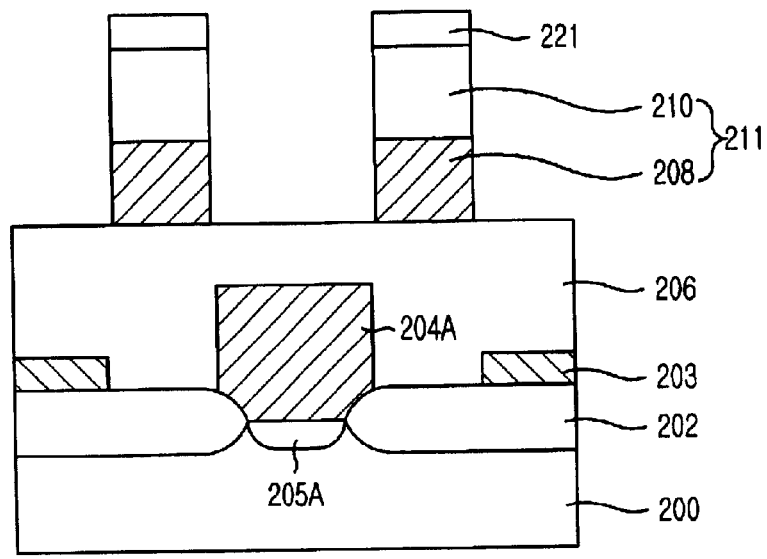
FIGS. 4A to 4H are cross-sectional views showing a fabrication process of a semiconductor device illustrated in FIG. 3.

FIG. 4A depicts steps forming a bit line conductive pattern 211. A conventional device separation process, for instance, the field oxide layer 202 is formed on the substrate 200 through a local oxidation of silicon (hereinafter referred as to LOCOS) process so as to be classified into the activation area and the device separation area.

Next, a transistor is formed on the activation area (not shown) of the substrate 200. That is, a thin gate oxide layer (not shown) gets grown on a surface of the activation area by employing a thermal oxidation process, and then, a gate 203 of the transistor for being supplied as a word line is formed thereon. It is preferable to form the gate 203 with a polycide structure stacked with a polysilicon layer and a tungsten silicide layer doped with highly concentrated impurities through a conventional doping process, such as an expansion process, an ion implantation process or an in-situ doping process. Although it is not illustrated, on top of the gate 203, a hard mask is constructed with either a silicon oxide layer or a silicon nitride layer, and on lateral sides of the gate 203, a spacer is formed with a silicon oxide layer or a silicon nitride layer.

Subsequently, the gate 203 is used as a mask to ion implant impurities so as to form a source area 205A and a drain area (not shown) on a surface of the activation area. One of the described doping areas is a capacitor contact area for contacting to a capacitor storage electrode and another is a bit line contact area for contacting to the bit line.

In the preferred embodiment of the present invention, the source area 205A is the capacitor contact area while the drain area 205B (referred to FIG. 2) is the bit line contact area.

An insulation layer (not shown) is then deposited on the transistor and the substrate 200 and etched by a photo etching process. On an entire surface of the etched insulation layer, a doped polysilicon layer is successively deposited and patterned so as to form pad electrodes 204A and 204B (referred to FIG. 2 in more detail) for being contacted to the source and drain areas 205A and 205B (referred to FIG. 2 in more detail). It is also possible to form the pad electrodes 204A and 204B through the use of SAC process.

A first inter-layer insulating layer 206 is formed on an entire surface the substrate 200 completed with the formation of the pad electrodes 204A and 204B by using a boro phospho silicate glass or an undoped silicate glass both having an excellent planarization property. Then, a reflow process, an etchback process or a chemical mechanical polishing (hereinafter referred as to CMP) process is employed to planarize the first inter-layer insulation layer 206. After the planarization, a subsequent photo etching process is proceeded to etch the first inter-layer insulating layer 206, thereby forming the bit line contact hole 207 (referred to FIG. 2) for exposing the pad electrode 204B contacted to the drain are 205B (referred to FIG. 2).

Such metal layers as tungsten (W), titanium (Ti) or titanium nitride (TiN) is deposited to fill the bit line contact hole 207 until having a thickness in a range from about 1000 Å to about 2000 Å, and a silicon nitride layer is subsequently deposited thereon with a thickness ranging from about 1500 Å to about 3000 Å. Then, on top of the silicon nitride layer, a metal layer such as tungsten (W), tungsten silicide (WSi), or tungsten nitride (WN) to be used as a hard mask is deposited till having a thickness in a range from about 200 Å to about 2000 Å.

The metal layer to be used as a hard mask, the silicon nitride layer and the metal layer for filling the bit line contact hole 207 are patterned by the photo etching process so that the line-type bit line conductive pattern 211, including the bit line 208 and the mask layer 210 constructed with the silicon nitride layer and the metal mask layer 221 stacked on the line-type bit line conductive pattern 211 are formed. Accordingly, the metal mask layer 221 and the mask layer 210 constructed with the silicon nitride layer establish a dual mask layer. The bit line 208 can also alternatively use a doped polysilicon in addition to metals.

Figure 4B:
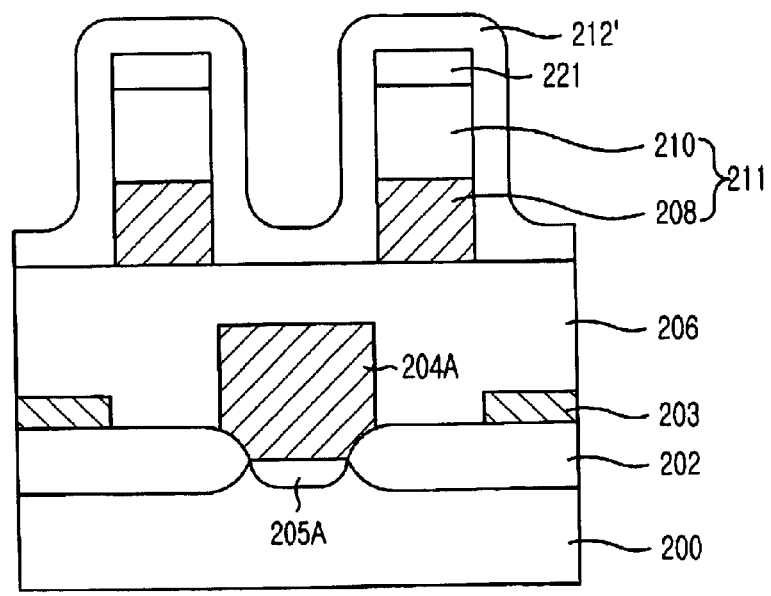

Referring to FIG. 4B, a silicon oxide layer 212' is deposited with a thickness ranging from about 50 Å to about 2000 Å in accordance with an overall profile including the metal mask layer 221. Also, it is preferable for the silicon oxide layer 212' to use an oxide layer generated by plasma enhanced chemical vapor deposition (hereinafter referred as to PECVD) technique, a high temperature oxide (hereinafter referred as to HTO) process or a medium temperature oxide (hereinafter referred as to MTO) process.

Figure 4C:
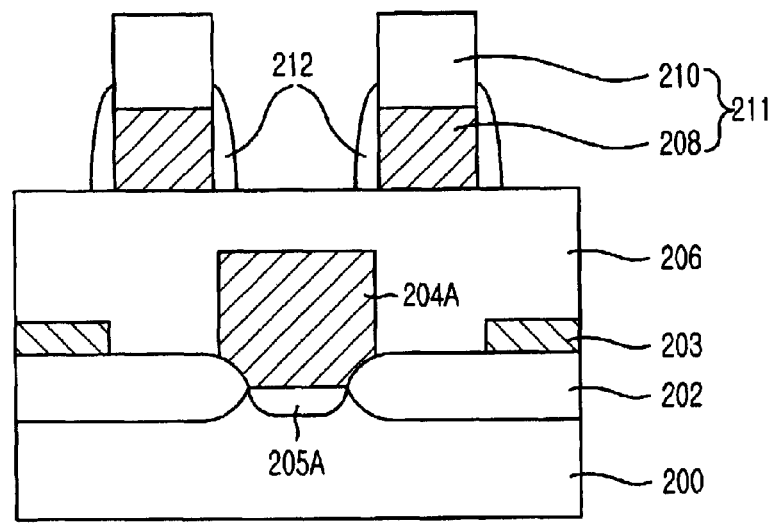

With reference to FIG. 4C, an anisotropic etching process is performed to the silicon oxide layer 212' (shown in FIG. 4B) with a condition that provides a high etching selection ratio between the silicon oxide layer and the silicon nitride layer so that a silicon oxide layer spacer 212 is formed with a height lower than a top part of the mask layer 210 in order to expose partially top and lateral sides of the bit line conductive pattern 211. At this time, the etching process is performed until the height of the inter-layer insulating layer 206 is lower than that of the bit line 208 or until the top surface of the first inter-layer insulating layer 206 is exposed.

The anisotropic etching process utilizes a gas mixed with $O_2$ gas, Ar gas and a mixture of gases wherein fluorine (F) is mixed with carbon (C) in a ratio of about 1 to about 1.5, e.g., any one selected from a group including $C_4F_8$, $C_5F_8$, $CH_2F_2$ and $C_4F_6$. After the anisotropic etching process, a part of the silicon oxide layer spacer 212 can be etched with a fluorine based etchant such as HF or buffered oxide etched (BOE) diluted to 300:1 in order to increase an opening for contact.

Additionally, in the conventional method for fabricating a semiconductor device, it is limited to obtain the etching selection ratio between the silicon oxide layer and the silicon nitride layer as described above, and thus, the loss of the mask layer 210 using the silicon nitride layer is inevitable when attempting to obtain a desired etching profile. Hence, the bit line loss and the erroneous etching profile might occur during the SAC etching process for forming a subsequent capacitor contact hole. For these reasons, in accordance with the present invention, the metal mask layer 221 is stacked on the mask layer 210 constructed with the silicon nitride layer so that the metal mask layer 221 is simultaneously removed by properly controlling the thickness of the metal mask layer 221 and etching conditions when forming the silicon oxide layer spacer 212.

Figure 4D:
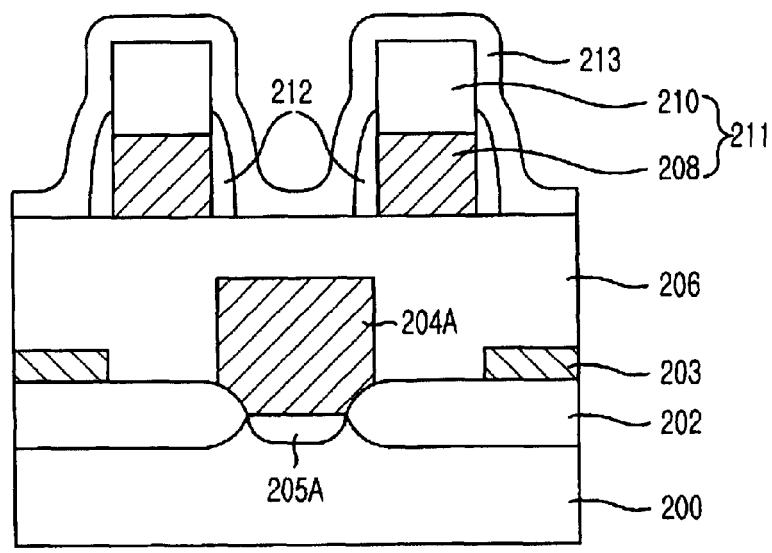

Referring to FIG. 4D, a silicon nitride layer 213 is deposited along an overall profile in which the silicon oxide layer spacer 212 is formed partially on lateral sides of the bit line conductive pattern 211 until having a thickness in a range from about 50 Å to about 500 Å by applying a low pressure chemical vapor deposition (hereinafter referred as to LPCVD) technique.

Figure 4E:
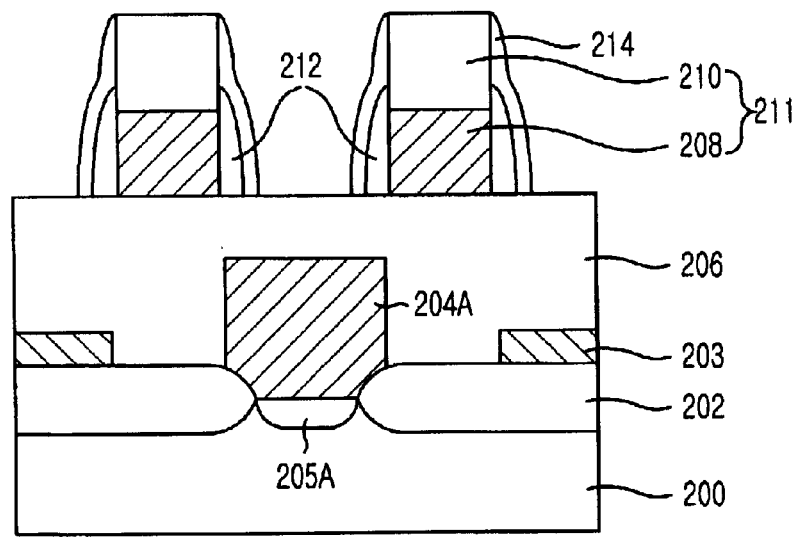

Continuously, referring to FIG. 4E, the silicon nitride layer 213 is anisotropically etched to form a silicon nitride layer spacer 214 on the exposed lateral sides of the bit line conductive pattern 211 and the surface of the silicon oxide layer spacer 212. The silicon nitride layer spacer 214 enacts as a shoulder for shielding the bit line conductive pattern 211 when performing the etching process for forming the SAC structure. The anisotropic etching process for forming the silicon nitride layer spacer 214 can be omitted, that is the silicon nitride layer 213 is left to cover the bit line conductive pattern 211 and the silicon oxide layer spacer 212.

Figure 4F:
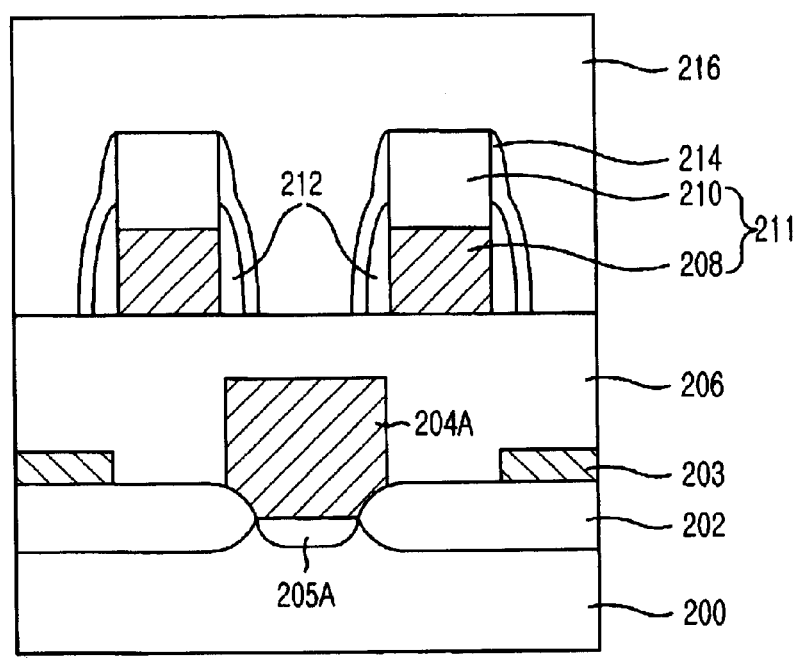

As shown in FIG. 4F, a second inter-layer insulating layer 216 is formed on an entire structure, in which the silicon nitride layer spacer 214 is formed, by depositing a silicon oxide layer in a thickness ranging from about 3000 Å to about 10000 Å.

Figure 4G:
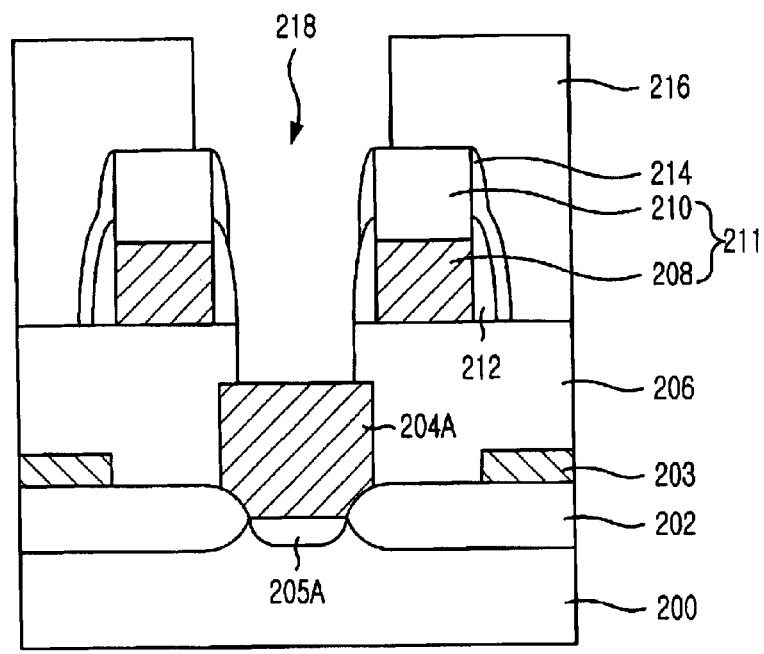

Referring to FIG. 4G, the second inter-layer insulating layer 216 is coated with a photo registry film which is, in turn, photo exposed and developed with use of a mask for forming the SAC structure so as to form a photo registry pattern (not shown) that opens an SAC forming area. Then, the second inter-layer insulating layer 216 is anisotropically etched by using the photo registry pattern as an etching mask under a condition of a high etching selection ratio between the silicon oxide layer and the silicon nitride layer so as to form a SAC contact hole 218 for exposing the source area 205A, the pad electrode 204A contacting to the source area 205A or the top of the silicon nitride layer spacer 214.

Figure 4H:
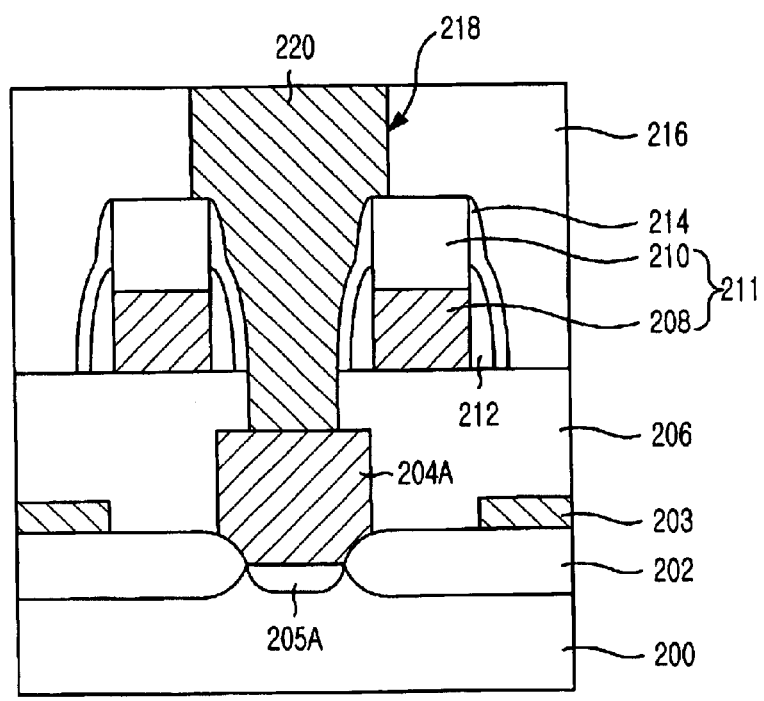

With reference to FIG. 4H, the photo registry pattern is removed through an ashing and a strip processes. After the removal, a capacitor conductive layer 220 for filling the SAC contact hole 218, e.g., a doped polysilicon layer is deposited by using the CVD technique. In subsequent to the deposition, the capacitor conductive layer 220 is removed by an etchback process or a CMP technique until exposing a top surface of the second inter-layer insulating layer 216 so that the capacitor conductive layer 220 is remained in a plug form only inside of the SAC contact hole 218.

Also, the capacitor conductive layer 220 can be alternatively patterned in a storage electrode pattern by a conventional photo etching process.

Next, a generally used capacitor formation process is applied to form a capacitor (not shown) including a storage electrode electrically contacting to the source area 205A through the SAC contact hole 218, a dielectric layer and a plate electrode.

In accordance with the preferred embodiment of the present invention as described above, it is possible to reduce loading capacitance between the bit line 208 and the capacitor conductive layer 220 within the SAC contact hole 218, i.e., bit line capacitance, since the lateral sides of the bit line 208 is encompassed with the silicon oxide layer spacer 212 having a dielectric constant lower than the silicon nitride layer. Also, the fact that the top part of the silicon oxide spacer 212 is positioned lower than that of the mask layer 210 constructed with the silicon nitride layer causes only the silicon nitride layer spacer 214 to be remained at corners of the bit line conductive pattern 211. Therefore, even if there occur misalignments during the photo etching process for forming the SAC structure, the silicon nitride spacer 214 provides a shoulder margin so as to block a short electric circuit between the bit line 208 and the capacitor conductive layer 220.

To enhance the effect on the decrease of the loading capacitance, the top part of the silicon oxide layer spacer 212 preferably formed in such that it is higher than a bottom part of the mask layer 210 using the silicon nitride layer but lower than a half of the thickness of the mask layer 210.

In addition, as seen from the provided preferred embodiment of the present invention, the metal mask layer 221 prevents the loss of the mask layer 210 during the anisotropic etching for forming the silicon oxide layer spacer 212.

By following the preferred embodiment of the present invention, there is an effect on the decrease of the loading capacitance, e.g., bit line and so on, which in turn, improves cell capacitance. It is also possible to prevent the loss of the mask layer using the silicon nitride layer allocated on the top part of the bit line. Ultimately, these advantages affect functions of a semiconductor as well as yields of a semiconductor device.

While the present invention has been described with respect to certain preferred embodiments, it will be apparent to those skilled in the art that various changes and modifications may be made without departing from the scope of the invention as defined in the following claims.

What is claimed is:

1. A method for fabricating a semiconductor device, comprising the steps of:

forming a plurality of patterns on a substrate, wherein the patterns are formed by stacking and patterning a first conductive layer, a silicon nitride mask layer and a metal mask layer on the substrate;

depositing a first silicon oxide layer along the profile containing the patterns;

etching the first silicon oxide layer for forming a silicon oxide spacer with a height lower than a top part of the silicon nitride mask layer so as to partially expose a top part of lateral sides of patterns and simultaneously etching the metal mask layer to expose the silicon nitride mask layer, wherein the metal mask layer prevents losses of the silicon nitride mask layer;

forming a silicon nitride spacer on a surface of the silicon oxide spacer and the lateral sides of the patterns;

forming a second silicon oxide layer on an entire structure in which the silicon nitride spacer is formed;

etching selectively the second silicon oxide layer to expose silicon nitride layer spacer and forming a self-align contact hole that is partially expanded to the top portion of the patterns; and forming a self-align contact structure by filling the self-align contact hole with a second conductive layer.

2. The method as recited in claim 1, wherein the metal mask layer is formed with a thickness in a range from about 200 Å to about 2000 Å.

3. The method as recited in claim 2, wherein the metal mask layer includes any one material selected from a group consisting of tungsten, tungsten silicide and tungsten nitride.

4. The method as recited in claim 1, wherein each of the silicon oxide spacer and the silicon nitride spacer is formed with a thickness in a range from about 50 Å to about 2000 Å.

5. The method as recited in claim 1, wherein the formation of the silicon oxide spacer is achieved by etching anisotropically the silicon oxide layer and the metal mask layer.

6. The method as recited in claim 5, wherein the anisotropic etching of the silicon oxide layer is performed by using a gas obtained by mixing fluorine with carbon in a ratio of about 1.5 to about 1.

7. The method as recited in claim 1, further comprising a step of etching the first silicon oxide layer with a fluorine based etchant.

8. The method as recited in claim 6, wherein the mixed gas is any one selected from a group consisting of $C_4F_8$, $C_5F_8$ and $C_4F_6$.

9. The method as recited in claim 1, wherein the first conductive layer is formed with a metal.

10. A method for fabricating a semiconductor device, comprising the steps of:

forming a first inter-layer insulating layer on a substrate constructed with transistors including a gate, a capacitor contact area and a bit line contact area;

etching selectively the first inter-layer insulating layer so as to form a bit line contact hole that exposes the bit line contact area;

forming a plurality of bit line patterns contacted to the bit line contact area through the bit line contact hole, a silicon nitride mask layer on the bit line patterns and a metal mask layer on the silicon nitride mask layer;

depositing a silicon oxide layer along a profile containing the bit line patterns;

etching the silicon oxide layer to form a silicon oxide spacer with a height lower than a top part of the silicon nitride mask layer so as to expose partially a top part of lateral sides of the bit line patterns and simultaneously etching the metal mask layer to expose the silicon nitride mask layer, wherein the metal mask layer prevents losses of the silicon nitride mask layer;

forming a silicon nitride spacer on the lateral sides of the bit line patterns and a surface of the silicon oxide layer spacer;

forming a second inter-layer insulating layer on an entire structure in which the silicon nitride spacer is formed;

etching selectively the second inter-layer insulating layer to expose the silicon nitride layer spacer on the capacitor contact area and forming a self-align contact hole expanding partially over each of the bit line patterns; and forming a self-align contact structure by filling the self-align contact hole with a conductive layer.

11. The method as recited in claim 10, wherein the metal mask layer is formed with a thickness in a range from about 200 Å to about 2000 Å.

12. The method as recited in claim 11, wherein the metal mask layer includes any one material selected from a group consisting of tungsten, tungsten silicide and tungsten nitride.

13. The method as recited in claim 10, wherein each of the silicon oxide spacer and the silicon nitride spacer is formed with a thickness ranging from about 50 Å to about 2000 Å.

14. The method as recited in claim 10, wherein the silicon oxide spacer is achieved by etching anisotropically the silicon oxide layer and the metal mask layer.

15. The method as recited in claim 14, wherein the anisotropic etching of the silicon oxide layer is performed by using a gas obtained by mixing fluorine with carbon in a ratio of about 1.5 to about 1.

16. The method as recited in claim 15, wherein the mixed gas is any one selected from a group consisting of $C_4F_8$, $C_5F_8$, $CH_2F_2$ and $C_4F_6$.

17. The method as recited in claim 10, wherein the conductive layer is formed with a metal.

* * * * *